(12) United States Patent
Shinomiya (10) Patent No.: US 6,204,566 B1
(45) Date of Patent: Mar. 20, 2001

(54) RESIN ENCAPSULATED ELECTRODE STRUCTURE OF A SEMICONDUCTOR DEVICE, MOUNTED SEMICONDUCTOR DEVICES, AND SEMICONDUCTOR WAFER INCLUDING MULTIPLE ELECTRODE STRUCTURES

(75) Inventor: Kohji Shinomiya, Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/252,917

(22) Filed: Feb. 19, 1999

Related U.S. Application Data (62) Division of application No. 08/650,969, filed on May 21, 1996, now Pat. No. 5,907,786, which is a continuation of application No. 08/380,439, filed on Jan. 30, 1995, now abandoned, which is a division of application No. 08/149,940, filed on Nov. 10, 1993, now abandoned.

(30) Foreign Application Priority Data

Nov. 11, 1992 (JP) .................................... 4-327335

(51) Int. Cl.⁷ .............................. H01L 21/92; H01L 21/44
(52) U.S. Cl. .................. 257/787; 257/778; 257/779; 257/784; 257/737; 257/738; 257/722
(58) Field of Search .................................. 257/787, 778, 257/779, 784, 737, 738, 722

(56) References Cited

U.S. PATENT DOCUMENTS

| | | | |
|---|---|---|---|
| 3,239,719 | 3/1966 | Shower | 257/778 |
| 3,798,754 | 3/1974 | Price et al. | 29/583 |
| 4,017,886 | 4/1977 | Tomono et al. | 257/784 |
| 4,067,104 | 1/1978 | Tracy | 29/626 |
| 4,742,023 | 5/1988 | Hasegawa | 437/183 |
| 5,258,648 | 11/1993 | Lin | 257/778 |
| 5,289,337 | 2/1994 | Aghazadeh et al. | 361/718 |
| 5,334,422 | 8/1994 | Myers et al. | 427/552 |
| 5,474,945 | * 12/1995 | Yamazaki et al. | 437/41 |
| 5,793,118 | * 8/1998 | Nakajima | 257/790 |
| 5,844,536 | * 12/1998 | Okada et al. | 345/94 |
| 5,849,606 | * 12/1998 | Kikuchi et al. | 438/613 |

FOREIGN PATENT DOCUMENTS

| | | |
|---|---|---|
| 0375869 | 7/1990 | (EP) . |
| 0490506 | 6/1992 | (EP) . |
| 60-241228 | 11/1985 | (JP) . |
| 62-136049 | 6/1987 | (JP) . |
| 62-147735 | 7/1987 | (JP) . |
| 62-230027 | 8/1987 | (JP) . |
| 1128546 | 5/1989 | (JP) . |
| 1256141 | 10/1989 | (JP) . |
| 2177540 | 7/1990 | (JP) . |
| 3240236 | 10/1991 | (JP) . |
| 4304640 | 10/1992 | (JP) . |
| 555278 | 3/1993 | (JP) . |
| 248907 | 8/1987 | (NL) . |

OTHER PUBLICATIONS

"Microelectronics Packaging Handbook", New York, Van Nostrand Reinhold, 1989, pp. 380, 828–829, and 833–834 TK7874.T824.

* cited by examiner

Primary Examiner—Leo P. Picard
Assistant Examiner—Hung Van Duong
(74) Attorney, Agent, or Firm—Leydig, Voit & Mayer

(57) ABSTRACT

A semiconductor integrated circuit device includes a semiconductor substrate having a first surface and including electrodes on the first surface of the semiconductor substrate; a glass coating film covering the first surface of the semiconductor substrate except the electrodes; an external electrode on the electrode in electrical contact with the electrode and having a polished external surface; and a cured resin layer on the glass coating film forming a barrier against intrusion of moisture and ions into the semiconductor substrate, and having the same area as the semiconductor substrate, and a polished external surface.

14 Claims, 8 Drawing Sheets

RESIN ENCAPSULATED ELECTRODE STRUCTURE OF A SEMICONDUCTOR DEVICE, MOUNTED SEMICONDUCTOR DEVICES, AND SEMICONDUCTOR WAFER INCLUDING MULTIPLE ELECTRODE STRUCTURES

This disclosure is a division of patent application Ser. No. 08/650,969, filed on May 21, 1996, now U.S. Pat. No. 5,907,786, which is a continuation of prior patent application Ser. No. 08/380,439, filed on Jan. 30, 1995, now abandoned, which is a division of prior patent application Ser. No. 08/149,940, filed on Nov. 10, 1993, now abandoned.

FIELD OF THE INVENTION

The present invention relates to a semiconductor integrated circuit package, a method of producing the package, a method of testing the package, and a method of mounting the package.

BACKGROUND OF THE INVENTION

Figure 7:
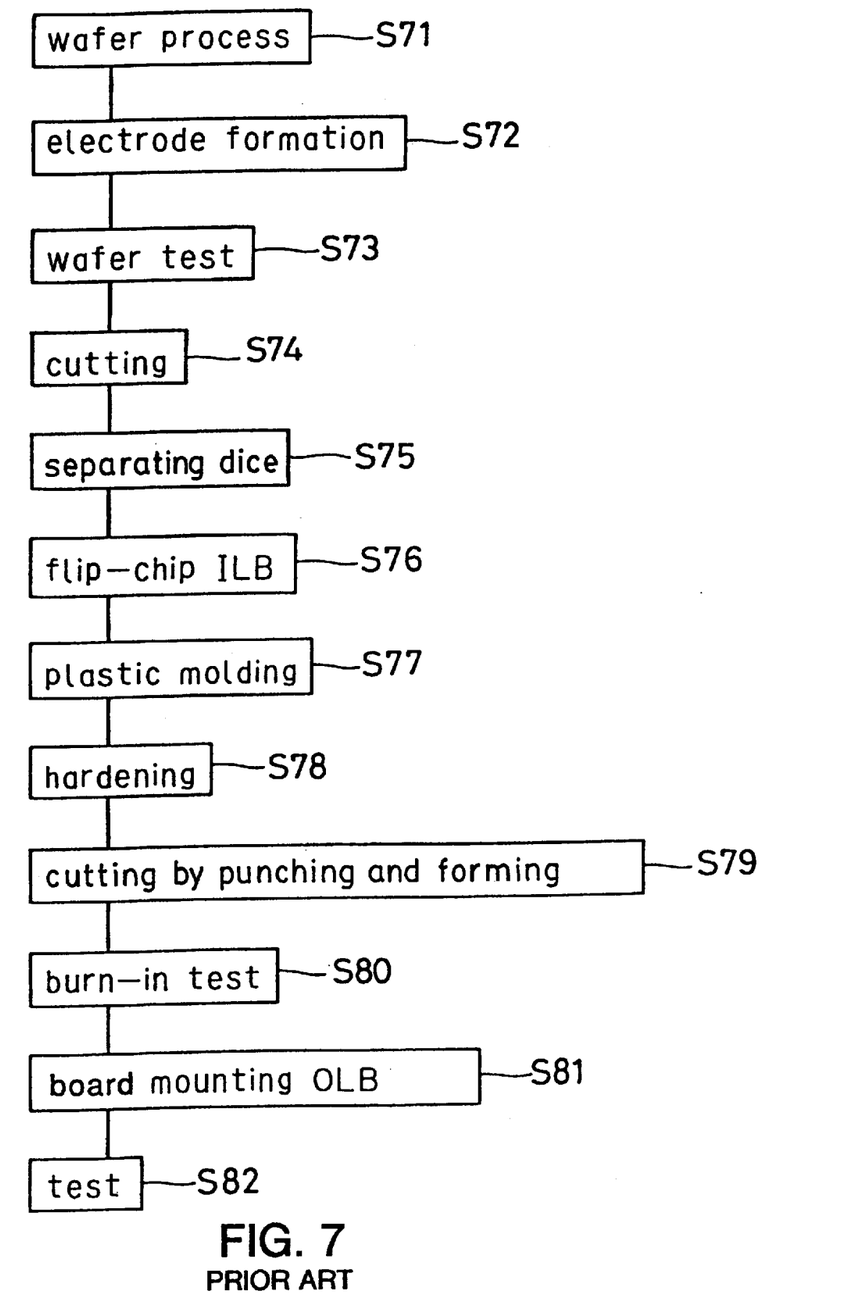
FIG. 7 is a diagram illustrating a production flow of a flip-chip IC semiconductor integrated circuit package according to the prior art TAB technique.

FIG. 7 is a flow chart of a manufacturing process for producing a flip-chip IC as a semiconductor integrated circuit package according to a prior art tape automated bonding (hereinafter referred to as TAB) technique. The technique illustrated in FIG. 7 includes inner lead bonding (hereinafter referred to as ILB) and outer lead bonding (hereinafter referred to as OLB). FIGS. 8(a)–8(e) are diagrams illustrating the flow of ILB and OLB in the manufacturing process of FIG. 7.

In the figures, reference numeral 1 designates an IC chip. Bumps 2 disposed on the IC chip 1 are terminals for ILB. A polyimide film carrier 4 for bonding to the IC chip 1 has inner leads 3 at its inner ends. A resin 5 is deposited on the rear surface of the IC chip 1 including the bonded portions between the bumps 2 and the inner leads 3. A printed circuit board 6 is provided for mounting of the IC chip 1 via a lead frame 3'. Wiring electrodes 7 are located on the printed circuit board 6. The lead frame 3' constituting the outer lead portions is fixed to the wiring electrode 7 on the printed circuit board 6 with solder 8.

Figure 8A:
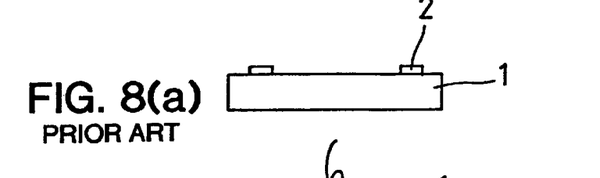
FIGS. 8(a)–8(e) are diagrams illustrating the processes of ILB and OLB in the production flow of a flip-chip IC semiconductor integrated circuit package according to a prior art TAB technique.
Figure 8B:
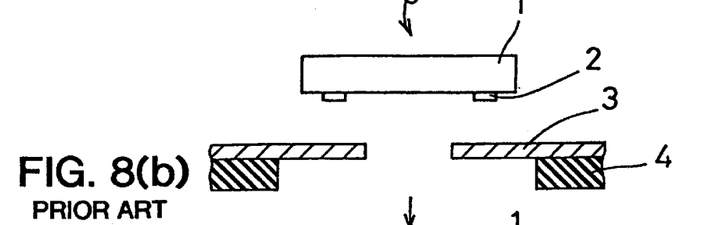
Figure 8C:
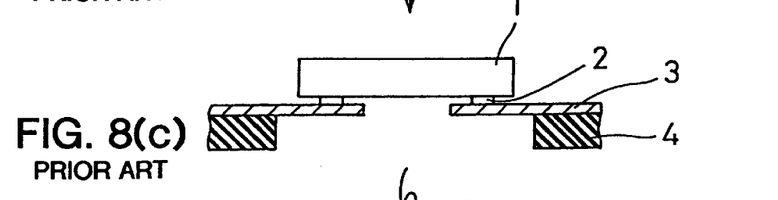

After semiconductor device layers are produced by a wafer process at step S71, electrodes are formed at step S72. Thereafter, a test is carried out in the wafer state at step S73 (wafer test), cutting is carried out at step S74, and chip separation is carried out at step S75. The Au bumps are formed on the electrodes of the IC chip 1 to produce the chip shown in FIG. 8(a). As shown in FIG. 8(b), the inner leads 3 on the polyimide film carrier 4 are thermally adhered, under pressure, to each other, thereby completing a flip-chip ILB at step S76, illustrated in FIG. 8(c).

Figure 8D:
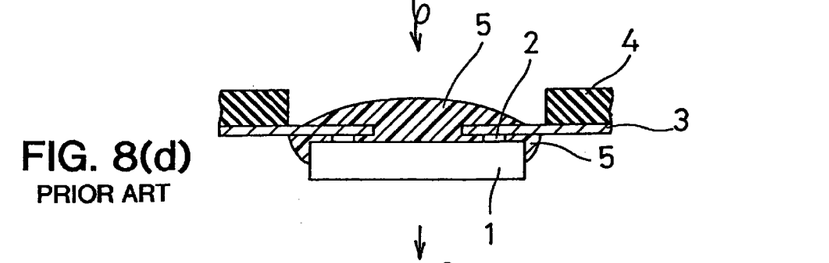
Figure 8E:
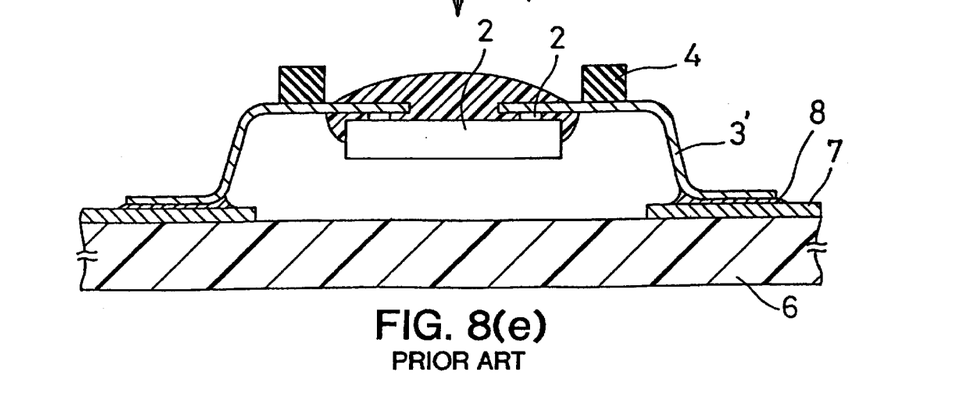

Plastic molding is carried out at step S77, see FIG. 8(d), hardening is carried out at step S78, and the outer leads (lead frames) 3' are cut by punching and formed into a predetermined size at step S79. Thereafter, a burn-in test is carried out at step S80 and the outer leads 2' are bonded to the wiring substrate 6 with solder 8, as shown in FIG. 8(e), thereby completing the substrate mounting OLB at step S81.

Heretofore, it was required to apply solder to the wiring substrate electrode 7. Methods of bonding and heating include pulse tool heating, constant tool heating, light beam heating, and laser heating. After the substrate mounting OLB is carried out, a test of the device is carried out at step S82.

Since the flip-chip package according to the prior art TAB technique has the above-described structure, in bonding the Au bumps to the Ni-Au gilded inner leads 3 in the ILB process, high temperature and high pressure are required and control of the applied pressure is difficult. When pressure is abruptly applied, the silicon dioxide film below the aluminum electrode of the IC chip 1 is damaged. In addition, the inductance of the lead 3' for the OLB causes deterioration of the IC chip characteristics and the lead is required to be as short as possible. This causes an especially difficult problem in high frequency circuits and high speed switching circuits. When a large current flows in an IC chip and causes heat generation, it is difficult to increase the heat conductivity between heat radiating fins and the IC chip.

SUMMARY OF THE INVENTION

It is an object of the present invention to provide a semiconductor integrated circuit chip that solves the described problems in the ILB process.

It is another object of the present invention to provide a method that is suitable for producing the described semiconductor integrated circuit.

It is still another object of the present invention to provide a semiconductor integrated circuit package and a method of producing the package that solves the problem of deterioration of the electrical characteristics due to the inductance of the leads and effectively utilizes the characteristics of an IC chip.

It is yet another object of the present invention to provide a method for mounting the described package that has a high heat radiation efficiency.

It is still another object of the present invention to provide a method for testing the described package that solves the problem in the conventional semiconductor package, i.e., curvature of an IC lead while inserting an IC chip under pressure into an IC socket fixed to a burn-in substrate for a burn-in test.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from the detailed description.

According to a first aspect of the present invention, in a semiconductor integrated circuit package and method of producing the package, an IC packaging process is carried out in a wafer state including external electrodes, resin is deposited and hardened on the wafer in the wafer state to form junctions between a glass coating and resin to produce a barrier for protecting the IC from the surrounding environment, cutting are carried out, and, thereafter, chips are separated from each other to produce flip-chips. Because the ILB process in the conventional TAB technique is omitted in the bump-forming process, the problem in the conventional method of controlling the applied pressure in the ILB process is solved. Further, the other problem in the conventional method that the electrical characteristics deteriorate due to the inductance of the leads is also solved because inner leads and outer leads are omitted. The outer lead-forming process is included in the bump production process, thereby effectively utilizing the IC chip characteristics. In addition, because the external electrodes are cleaned, the wafer surface is flattened, and when the IC chip is mounted on a substrate, production and incorporation of an IC chip into a package are performed easily, stably, and precisely.

According to a second aspect of the present invention, a flip-chip package produced after separation of a chip from a wafer is provisionally mounted on a burn-in board by soldering and then a burn-in test is carried out. The flip-chip is heated to melt the soldered part, and the package is taken off the burn-in board and mounted on a printed circuit board with the external electrodes directly bonded to the wiring patterns on the board, thereby completing incorporation of the elements onto the printed circuit board. Therefore, a problem in the conventional method that an IC lead is likely to become curved while being inserted into an IC socket under pressure in the conventional burn-in test is solved, resulting in a highly reliable device.

According to a third aspect of the present invention, a method of producing a semiconductor integrated circuit package includes packaging plural kinds of ICs into respective flip-chip packages, mounting those packages on a printed circuit board by soldering, heating for surface tension position correction, and repeating multi-chip system tests while replacing faulty chips, thereby constructing multi-chip modules. Thereby, highly reliable multi-chip modules are obtained.

According to a fourth aspect of the present invention, a method of mounting a semiconductor integrated circuit package includes placing solder on a printed circuit board and adhering radiating fins with a heat conductive grease to a surface opposite a front surface of the described protective package, the front surface having electrodes thereon. Therefore, heat generated in the IC chip is directly radiated through the radiating fins, resulting in a high heat radiation efficiency.

DETAILED DESCRIPTION OF THE PREFERRED EMBODIMENTS

Embodiment 1

Figure 1A:
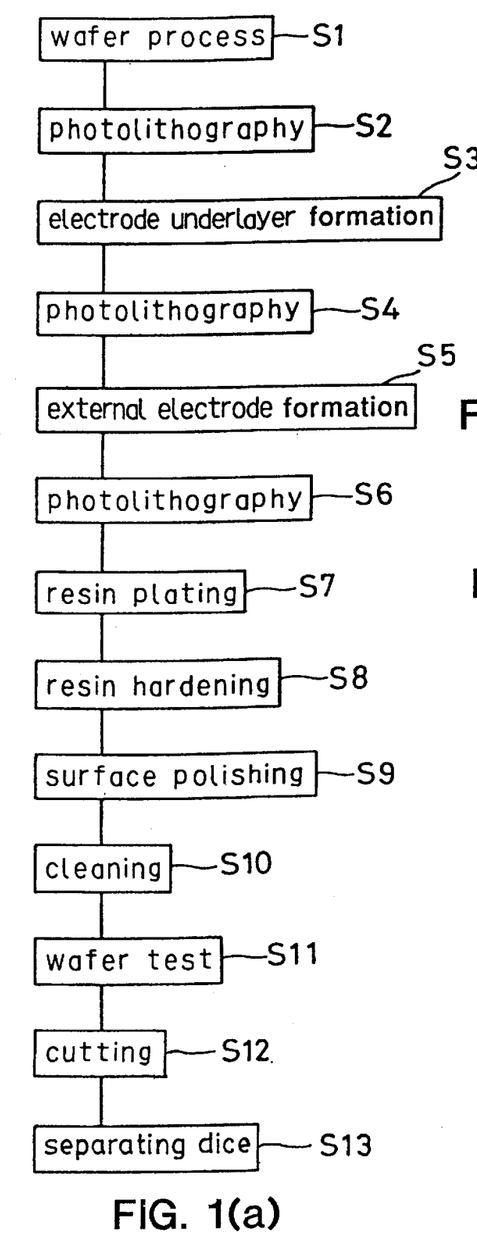
FIG. 1(a) is a flow chart and FIGS. 1(b)–1(h) are diagrams illustrating a production flow for producing a flip-chip semiconductor integrated circuit device package according to a first embodiment of the present invention.

FIG. 1(a) is a flow chart and FIGS. 1(b)–1(f) are diagrams illustrating a production flow for producing a flip-chip semiconductor integrated circuit package according to a first embodiment of the present invention.

Figure 1B:
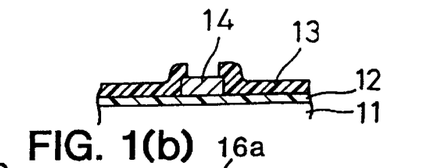

In FIG. 1(b), the electrode 14 comprising aluminum wiring is exposed on the wafer just before completing the wafer processing of a semiconductor integrated circuit, step S1 of FIG. 1(a), and the other parts are coated with glass coating 13, thereby protecting electronic circuits on the wafer surface.

Figure 1C:
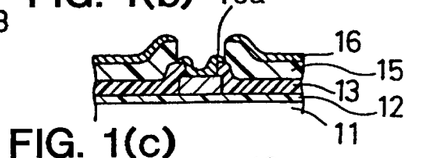

In FIG. 1(b), reference numeral 11 designates a substrate including epitaxially grown layers and diffused layers. A silicon dioxide film 12 is formed on the substrate 11. A glass coating 13 is provided as a surface protecting film. An electrode 14 of an electronic circuit is formed of aluminum. Reference numeral 15 in FIG. 1(c) designates photoresist. Metal 16 comprising Cr/Cu/Au is deposited over the photoresist 15 to form an electrode underlayer-forming part 16a on the electrode 14, as shown in FIG. 1(c). Reference numeral 17 in FIG. 1(e) designates photoresist. Metal 18 in FIG. 1(e) comprising Au is deposited over the photoresist 17 to form an external electrode-forming part 18a. Reference numeral 19 in FIG. 1(g) designates photoresist. Reference numeral 20 in FIG. 1(g) designates resin on the glass coating film 12.

As illustrated in FIG. 1(a), a wafer process is carried out at step S1 whereby a wafer having an aluminum electrode 14 and a surface protecting film 13 on the substrate 11 with an intervening oxide film 12 is produced, as shown at the top of FIG. 1(b). In order to produce an external electrode for the electrode 14, a photolithography technique is employed to form the photoresist 15 at step S2. Sputtering of Cr/Cu/Au 16 is carried out to produce an underlayer electrode 16a on the electrode 14 at step S3, producing the structure of FIG. 1(c). The excess metal 16 is removed by lift-off to produce the structure of FIG. 1(d).

Figures 1D, 1E:
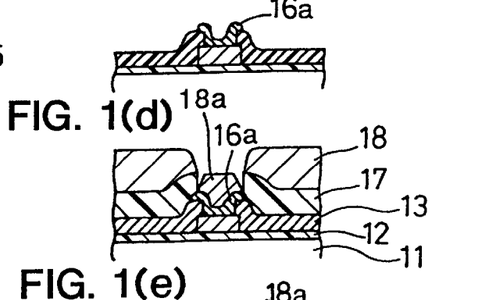
Figure 1F:
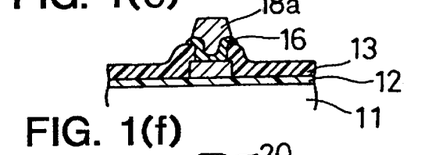

A photolithography technique is also employed to form the photoresist 17 at step S4 and electroplating of Au 18 is carried out to produce the external electrode 18a on the electrode underlayer-forming part 16a at step S5, producing the structure of FIG. 1(e). The external electrode 18a functions as an outer lead. Excess metal 18 is removed by lift-off to produce the structure of FIG. 1(f).

Figure 1G:
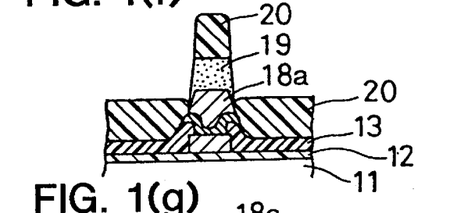

In addition, a photolithography technique is employed to form the photoresist 19 at step S6, the resin 20 is applied at step S7, and it is hardened to produce a barrier between the resin 20 and the glass coating film 13 at step S8, as shown in FIG. 1(g).

By producing this barrier, i.e., a contact part between the resin and the glass coating, it is possible to prevent intrusion of water or sodium ions into the IC chip, thereby improving the reliability of the device. The production of the barrier is quite important in the packaging process.

Figure 1H:
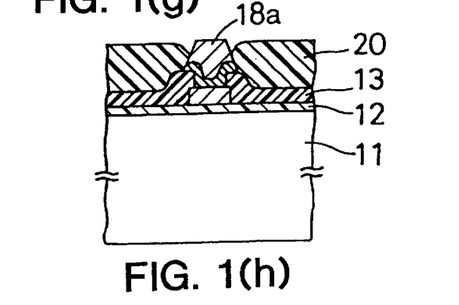

In order to flatten the wafer surface and clean the external electrodes, surface polishing is carried out at step S9. This surface polishing is quite important in the present invention and produces the structure of FIG. 1(h).

In the above-described process, photoresist films for photolithography steps are employed twice, i.e., in the electrode underlayer-forming process at steps S2 and S3 and in the external electrode-forming process at steps S4 and S5. However, this photolithography technique need be used only once for forming the electrode underlayer, the external electrode-forming being carried out successively on the entire surface of the wafer. Then those electrodes are etched together at the same time.

The formation of the barrier, i.e., the contact between the resin and the glass coating, is important and, further, the flatness of the wafer surface and the cleanliness of the external electrode, which are obtained by surface polishing of the wafer, are important.

While Cr/Cu/Au and Au are employed in forming electrodes in the above-described process, other metals, for example, Mo, W, Ti, In, or Ni may be employed. Further, the insulating film is not restricted to a silicon dioxide film and other kinds of films, for example, a silicon nitride film, may be employed.

In the flip-chip package of this first embodiment, as described above, an IC packaging process is carried out in a wafer state, thereby enabling batch processing, leading to improved production efficiency and a low cost and high precision package.

In addition, because the ILB in the prior art packaging process is included in the bump formation in the external electrode-forming processing and, further, the outer lead formation is included in the bump formation, batch processing in the wafer state can be carried out, leading to a low cost and high precision package.

Because the inner leads and the outer leads are included in the external leading out electrode, the leads can be made extremely short and deterioration of the electrical characteristics due to inductance of the leads is avoided, effectively utilizing the IC chip characteristics. This improvement reduces the load in the input/output interface circuit of the IC chip, enabling driving by a small current, whereby current consumption is reduced. In addition, the circuit size can be minimized and the IC chip area can be reduced since the current driving ability is small and heat generation from the IC chip is also reduced. Accordingly, the present invention favorably influences not only electrical characteristics but also the peripheral circuits and mounting techniques, thereby further realizing a low cost and high precision package.

Embodiment 2

Figure 2:
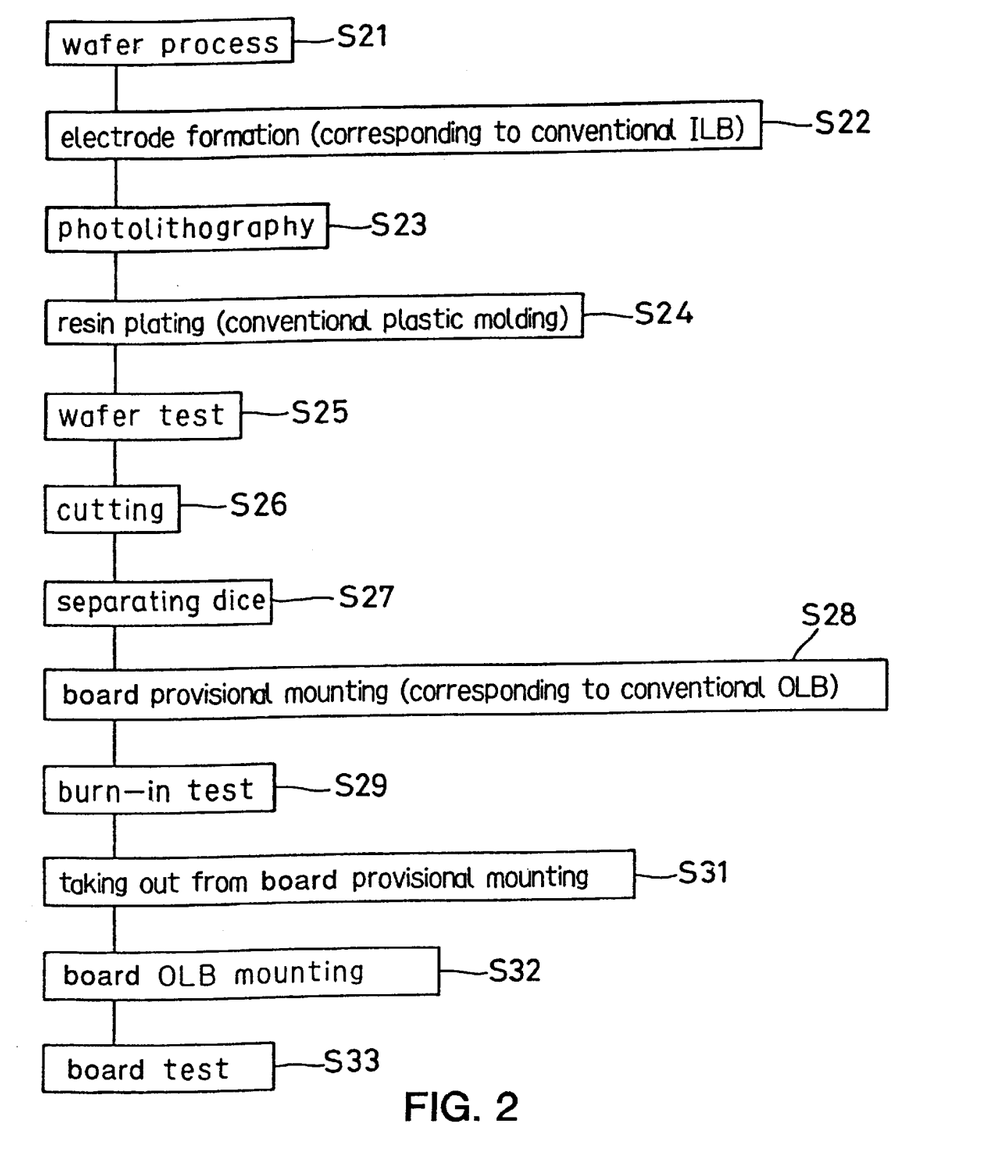
FIG. 2 is a diagram illustrating a flow for a burn-in process of a flip-chip package according to a second embodiment of the present invention.

FIG. 2 is a diagram illustrating a production semiconductor integrated circuit package according to a second embodiment of the present invention and explaining the burn-in process of a flip-chip package as compared with the prior art TAB package.

In FIG. 2, after the wafer processing at step S21, an electrode-forming process which corresponds to the prior art ILB is carried out in the wafer state at step S22. After the photolithography process is carried out at step S23, a barrier, i.e., a contact between the resin and the glass coating for protecting the electronic circuits at the surface of the IC chip, is produced at step S24. Then, a test of electrical characteristics is carried out by fitting a probe to the wafer at step S25. After the wafer test is carried out, dicing/slicing/ cutting are carried out at step S26, chip separation is carried out at step S27, and provisional mounting of an IC chip on a board is carried out at step S28, corresponding to the prior art OLB.

Up to this process, step S22 of FIG. 2 corresponds to steps S2 and S5 of FIG. 1(*a*), step S23 of FIG. 2 corresponds to step S6 of FIG. 1(*a*), step S24 of FIG. 2 corresponds to steps S7 to S10 of FIG. 1(*a*), step S25 of FIG. 2 corresponds to step S11 of FIG. 1(*a*), step S26 of FIG. 2 corresponds to step S12 of FIG. 1(*a*), and step S27 of FIG. 2 corresponds to Figure S12 of FIG. 1(*a*).

The substrate provisional mounting at step S28 aims at two points: carrying out the burn-in test at step S29, and solder plating the external electrode. When solder plating of the external electrode is carried out and the IC is left in the air, it is possible to prevent deterioration of the solder wettability of the external electrode.

In the burn-in test at step S29, by provisionally mounting an IC chip on a burn-in board, it is possible to assure secure electrode contacts. Even when the same burn-in board is repeatedly used, secure electrode contacts are achieved, the number of times a burn-in board can be used is increased, and the cost of the burn-in test is reduced.

In an IC for which a burn-in test is not required, the provisional mounting of an IC chip on a board is not necessarily required. However, to prevent deterioration of solder wettability, solder plating is preferably carried out. When there is no problem with solder wettability, solder plating is not required.

After the burn-in test at step S29 is completed, the IC is removed from the burn-in board at step S31 and the IC is placed in a chip tray.

Thereafter, the IC is mounted on a printed circuit board with other ICs and OLB is carried out at step S32. Then, the incorporation of the IC chip on the printed circuit board is completed and an operational test of the printed circuit board, i.e., the board test, is carried out at step S33 whereby the process of mounting the IC onto a printed circuit board is completed.

In this second embodiment, when the burn-in test is required, electrical contact is realized not by inserting the IC chip into an IC socket under pressure but by melting solder, resulting in no faulty electrical contacts. In addition, deterioration in the electrical characteristics due to the inductance of socket leads is avoided and the burn-in test of an IC chip is performed in a state closer to actual use, even for high frequency circuits or high speed switching circuits, enabling a precise burn-in test.

Embodiment 3

FIG. 3(*a*) is a flow chart and FIGS. 3(*b*)–3(*f*) are diagrams illustrating soldering flow processing, i.e., mounting of an IC chip on a burn-in test board for producing a flip-chip package according to a third embodiment of the present invention. In FIG. 3(*b*), reference numeral 21 designates a burn-in test board. Printed wiring 22 is located on the burn-in test board 21. Solder paste is deposited on the printed wiring 22 on the burn-in test board 21 by a printing technique. Reference numeral 24 in FIG. 3(*c*) designates a flip-chip package IC according to this third embodiment of the present invention.

Solder is printed on the burn-in test board 21 at step S41, see FIG. 3(*b*), and then a flip-chip package 24 is picked up with a vacuum collet at step S42 and mounted on the burn-in test board 21 by positioning it on the solder 23 at step S44, as shown in FIG. 3(*c*).

Next, as illustrated in FIG. 3(*d*), heating is carried out at step S45 to melt the solder paste 23, bonding the external electrodes of this IC to the printed wiring 22. Meanwhile, when the solder paste 23 is melted, balancing of the IC works well because of the surface tension of the solder and the position of the IC is corrected due to the surface tension along the pattern of the printed wiring 22 on the substrate 21 at step S46. The surface tension positional correction at step S46 corrects the position of the IC chip, particularly the positions of the electrodes, because of the surface tension of the melted solder, so that the leads are coincident with the wiring patterns of the printed circuit board. After this surface tension positional correction has been performed, the temperature decreases by heat radiation at step S47 and the solder 23 is solidified, completing the mounting of the IC onto the substrate.

Figure 3A:
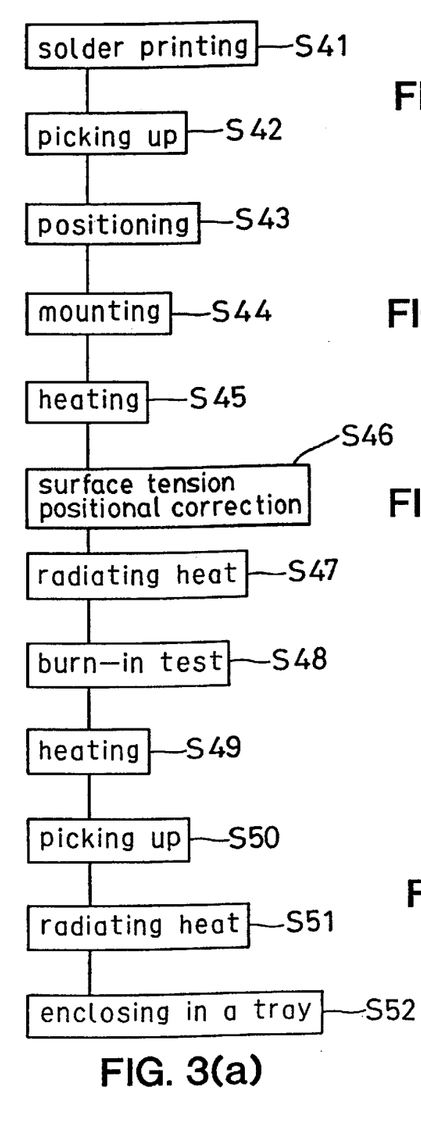
FIG. 3(a) is a flow chart and FIGS. 3(b)–3(f) are diagrams illustrating a soldering flow comprising mounting a flip-chip package on a burn-in test substrate and removing the flip-chip from the burn-in test substrate according to a third embodiment of the present invention.
Figure 3B:
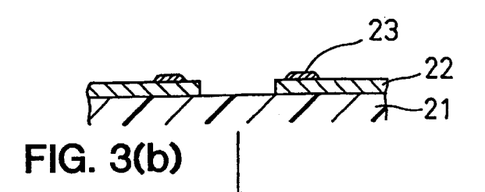
Figure 3C:
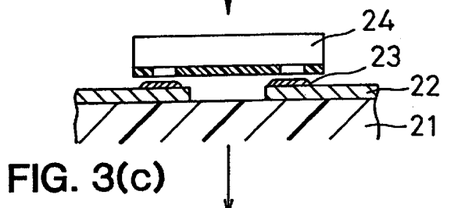
Figure 3D:
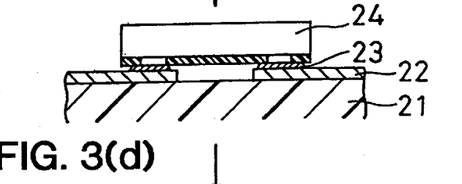

Thereafter, the burn-in test is carried out at step S48. After the burn-in test is completed, quality assurance inspection or the like of the IC chip is carried out and the test of the electrical characteristics is completed. Here, not only the burn-in test but also an ordinary test at room temperature may be carried out upon soldering the IC to the substrate 21 in this manner. Thus, the mounting that is conventionally carried out employing an IC socket is carried out by soldering.

Figure 3E:
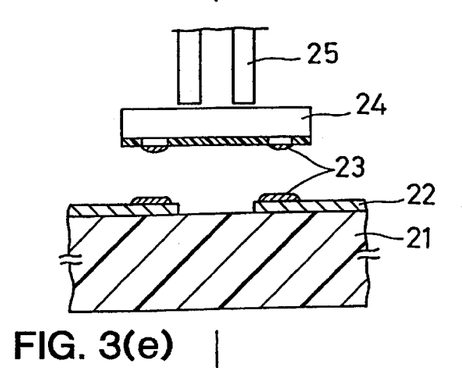
Figure 3F:
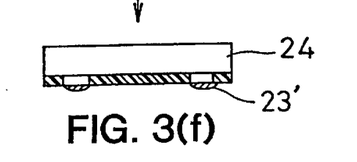

After completing these tests, heating is again carried out to melt the solder at step S49 and the IC chip is picked up by a vacuum collet at step S50, illustrated in FIG. 3(e). Then, the IC is taken from the substrate, as shown in FIG. 3(f), and heat is radiated at step S51, solidifying the solder. Thereafter, the chip is placed in a tray at step S52. Here, solder plating of the solder 23' is carried out to the external electrode of the IC 24 and solder wettability for the next soldering process is improved.

In this third embodiment, described above, similar to the second embodiment, the mounting of an IC chip on the burn-in board is carried out not by inserting the IC chip into an IC socket or the like under pressure but by connecting electrodes by melting the solder. Therefore, there are no faulty contacts and no deterioration in electrical characteristics due to the inductance of leads of the socket or the like. This results in the burn-in test being carried out in a state close to actual use even for a high frequency circuit or a high speed switching circuit, improving the precision of the burn-in test.

Embodiment 4

Figure 4:
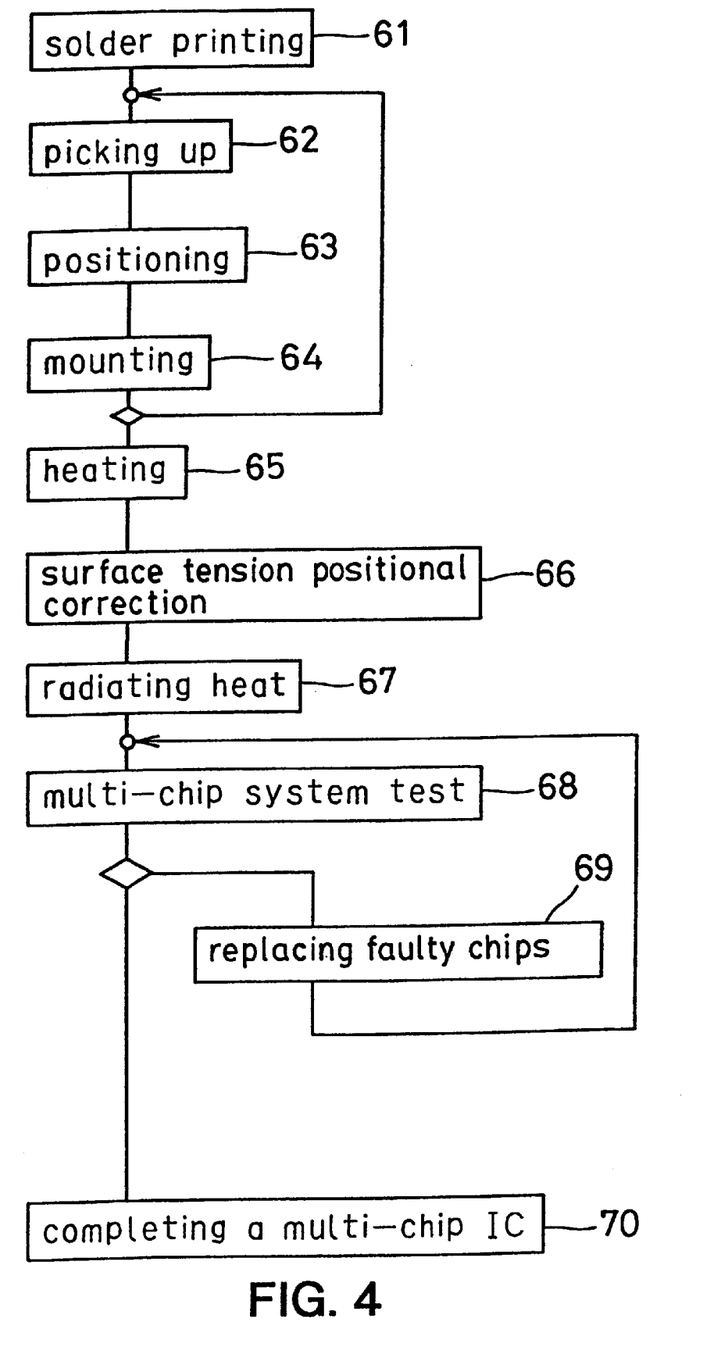
FIG. 4 is a diagram illustrating an example of a flow for constructing a multi-chip module of a flip-chip package according to a fourth embodiment of the present invention.

FIG. 4 is a diagram illustrating a flow for incorporating a flip-chip package into a multi-chip module (hereinafter referred to as MC) according to a fourth embodiment of the present invention.

Solder paste is printed on a printed circuit board at step S61, the flip-chip package of the present invention is picked up by the vacuum collet at step S62, and positional alignment is carried out at step S53 for the mounting at step S64. By repeating this operation, a plurality of different kinds of ICs are mounted. After completing the mounting, heating is carried out at step S65 and the solder paste on the printed circuit board is melted for positional correction at step S66 similar to that performed at step S46 in the third embodiment. Thereafter, heat is radiated at step S67, completing the soldering and mounting of a plurality of different kinds of ICs.

Next, a tester is connected by applying a probe or the like to the test terminals of the board on which the IC is mounted, carrying out a multi-chip system test at step S68. If a faulty IC is discovered, heating is again carried out and faulty ICs are removed. Non-faulty ICs, which are separately prepared, are mounted at step S69 and positional correction is carried out. Thereafter, heat is radiated to complete solder mounting of a plurality of different kinds of ICs. The multi-chip system test at step S68 is carried out again to complete the multi-chip IC (MC) at step S70.

Figure 5A:
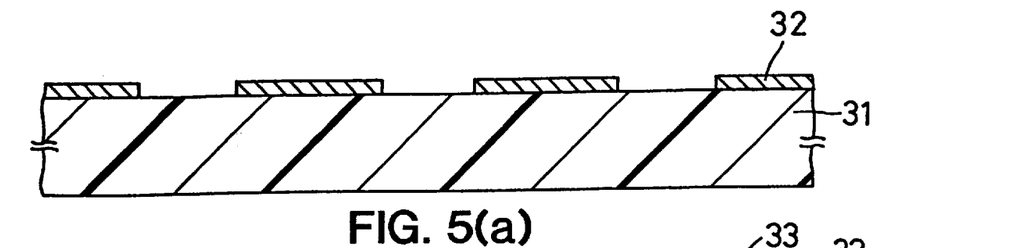
FIGS. 5(a)–5(d) are diagrams illustrating a flow for soldering in constructing a multi-chip module of a flip-chip package according to the fourth embodiment of the present invention.
Figure 5B:
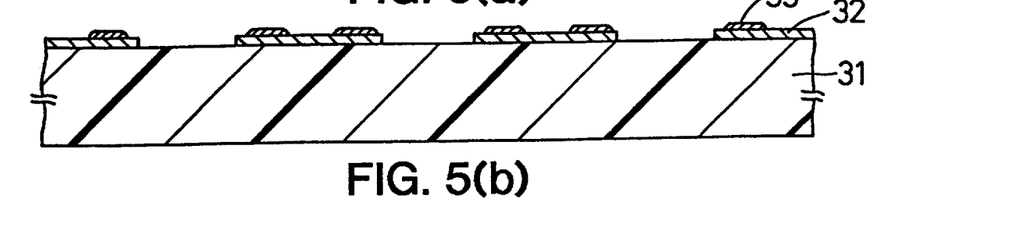

FIGS. 5(a)–5(d) are diagrams illustrating soldering of the above-described flip-chip package to a multi-chip module. In FIG. 5(a), reference numeral 31 designates an MC wiring substrate. A printed wiring 32 is present on the MC printed circuit board 31. Solder paste 33, in FIG. 5(b), is printed on the printed circuit board 31 by a printing technique. Reference numeral 24, in FIG. 5(c), designates a flip-chip package IC of this fourth embodiment of the present invention.

Figure 5C:
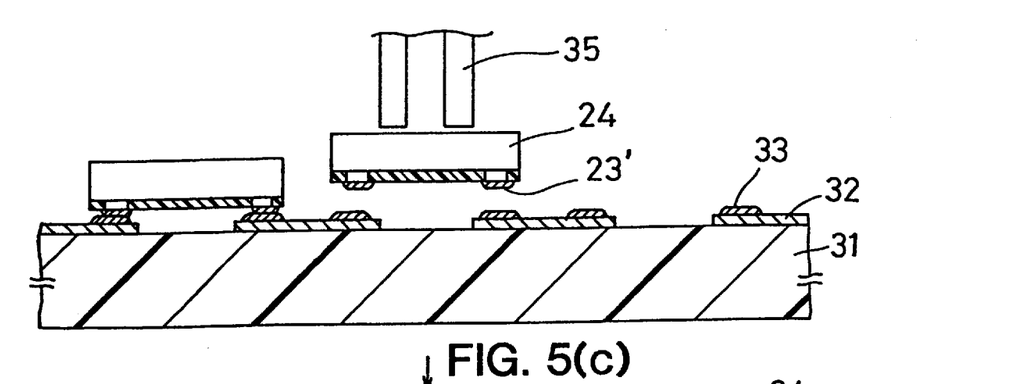

In this soldering process, the IC chip 24 is picked up with a vacuum collet 35, as shown in FIG. 5(c), and mounted and positioned on the printed circuit board 31 as in the mounting step S64 of FIG. 4(a). In FIG. 5(c), reference numeral 23' designates the solder plating of the solidified and fixed external electrode and reference numeral 33' designates solder which is solidified by radiating heat after the solder paste 22 and the solidified solder 23' of the solder plating are melted.

Figure 5D:
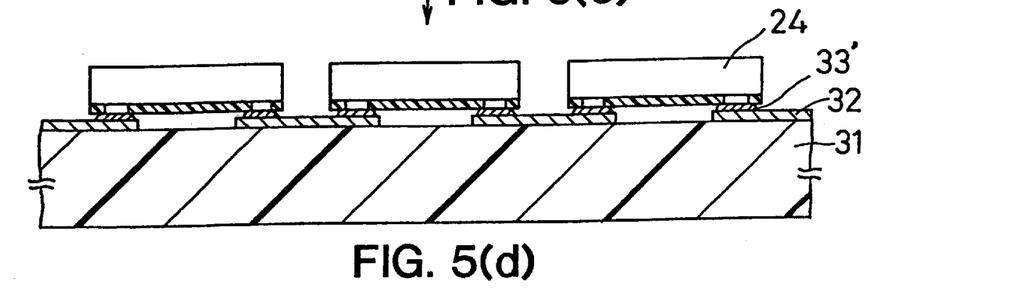

In this fourth embodiment, as in the second and third embodiments, the mounting of IC chips onto a multi-chip module with flip-chip packages, as shown in FIG. 5(d), can be accomplished by carrying out the multi-chip system test, not by inserting the chip into an IC socket or the like under pressure, but by making electrode connections by melting solder without causing any faulty contacts or any deterioration of electrical characteristics due to inductances of the leads of the socket or the like in a state close to the actual use state even for high frequency circuits and high speed switching circuits whereby a highly reliable multi-chip module is realized.

Embodiment 5

Figure 6:
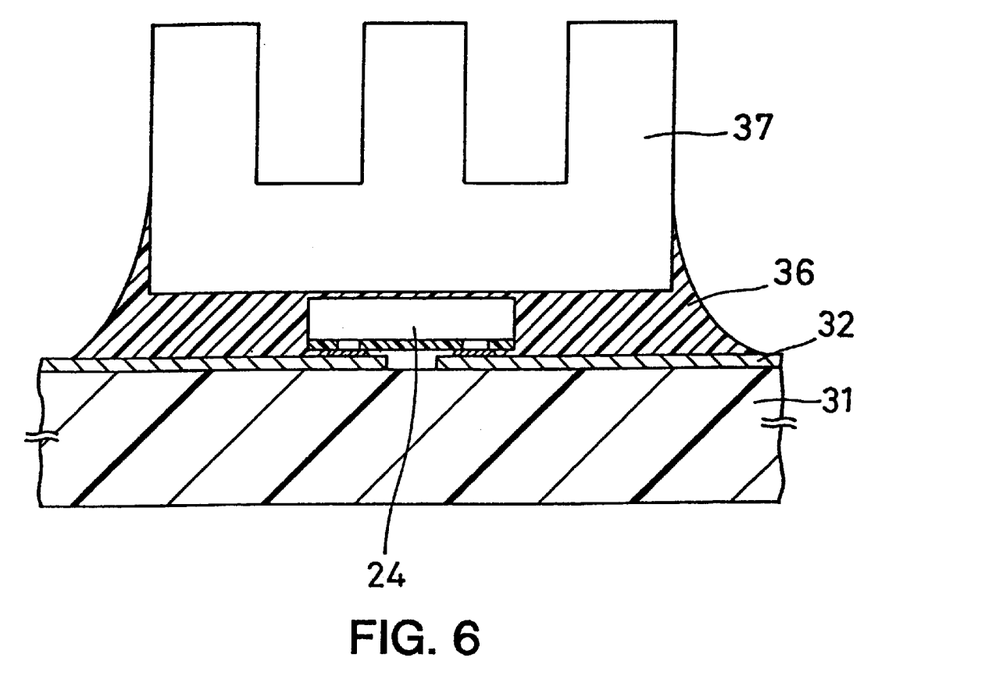
FIG. 6 is a diagram illustrating a structure in which radiating fins are fixed to the IC chip for radiating heat generated inside the IC of a flip-chip package according to a fifth embodiment of the present invention.

FIG. 6 is a diagram illustrating a method for attaching radiating fins for radiating heat generated inside the IC chip according to a fifth embodiment of the present invention.

In FIG. 6, a printed circuit board 31 has printed wiring 32 on it. A flip-chip package IC 24, according to this fifth embodiment of the present invention, is mounted on the printed circuit board 31 and adhered to the printed wiring 32 with solidified solder paste 33'. Silicone grease 36 is provided to fix radiating fins 37 to the rear surface of the flip-chip package IC 24.

In the method of attaching radiating fins according to this fifth embodiment, the radiating fins 37 are fixed with the silicone grease 36 to the rear surface of the flip-chip package IC 24. The packaged IC is soldered to the printed wiring 32 on the printed circuit board 31. The grease 36 is not restricted to silicone grease but other greases that are heat conductive can be employed.

As illustrated in FIG. 6, in the flip-chip package of this fifth embodiment, for radiating heat when a lot of current flows through an IC chip, radiating fins directly contact the exposed rear surface of the IC chip, utilizing the rear surface that is opposite the front surface having electrodes, whereby a mounting having a high heat radiation efficiency is realized. Thereby, a larger current can flow through the IC chip whereby higher frequency circuits and higher speed switching circuits are realized.

As is evident from the foregoing description, according to a first embodiment of the present invention, an IC packaging process is carried out with an IC in a wafer state including external electrodes including depositing and hardening a resin on the wafer to form a junction between a glass coating and the resin, producing a barrier protecting the IC from the surrounding environment, and then carrying out cutting. Thereafter, chips are separated to produce a flip-chip package. Because the ILB process of the convention TAB technique is omitted from the bump forming process, the problem in the conventional method of controlling the applied pressure in the ILB process is solved. Further, the other problem in the convention method that the electrical characteristics are deteriorated by the inductance of the leads is also solved because inner leads and outer leads are omitted. The outer lead-forming process is included in the bump production process, effectively utilizing the IC chip characteristics. In addition, because the external electrodes are cleaned and the wafer surface is flattened and then the IC chip is mounted onto a substrate, production and incorporation of an IC chip into a package are performed easily and stably with high precision.

According to a second embodiment of the present invention, a flip-chip package produced after separating chips is provisionally mounted on a burn-in board by soldering. Then, a burn-in test is carried out, the package is heated to melt the soldered part, and the package is taken off the burn-in board and mounted onto a printed circuit board with the external electrodes directly bonded to the wiring patterns on the board, completing mounting of the element on the printed circuit board. Therefore, the problem in the conventional method that an IC lead is likely to be curved by inserting the IC chip into an IC socket under pressure in the conventional burn-in test is solved, resulting in a highly reliable device.

According to a third embodiment of the present invention, a method of producing a semiconductor integrated circuit package includes packaging plural ICs into respective flip-chip packages, mounting those packages on a printed circuit board by soldering, heating and melting the solder to correct placement of the packages, and repeating multi-chip system tests after replacing faulty chips, thereby constructing multi-chip modules. Thus, highly reliable multi-chip modules are produced.

According to a fourth embodiment of the present invention, a method of mounting a semiconductor integrated circuit package includes depositing solder on a printed circuit board and adhering heat radiating fins with heat-conductive grease to a rear surface opposite a front surface of an IC chip in the described protective package. The front surface has electrodes thereon. Therefore, the heat generated in the IC chip is directly radiated through the radiating fins, resulting in a high heat radiation efficiency.

What is claimed is:

1. A semiconductor integrated circuit device comprising:
   a semiconductor substrate having a first surface and including an electrode on the first surface of the semiconductor substrate;
   a glass coating film covering the first surface of the semiconductor substrate except the electrode;
   an external electrode on the electrode, in electrical contact with the electrode, and having a substantially planar polished external surface; and
   a cured resin layer on the glass coating film, forming a barrier against intrusion of moisture and ions into the semiconductor substrate, the cured resin layer having the same area as the semiconductor substrate and a substantially planar polished external surface.

2. The semiconductor integrated circuit device as defined in claim 1 wherein the external electrode has a larger area than the electrode.

3. The semiconductor integrated circuit device as defined in claim 1 including an electrode underlayer between said electrode and said external electrode.

4. The semiconductor integrated circuit device as defined in claim 1 including a silicon dioxide film disposed on the substrate and wherein the electrode is disposed in an aperture in the silicon dioxide film.

5. The semiconductor integrated circuit device as defined in claim 1 including a silicon nitride film disposed on the substrate and wherein the electrode is disposed in an aperture in the silicon nitride film.

6. The semiconductor integrated circuit device as defined in claim 1 wherein the substantially planar polished external surface of the cured resin layer and the substantially planar polished external surface of the external electrode are substantially coplanar.

7. A multi-chip module comprising a plurality of semiconductor devices of claim 1 soldered to a multi-chip module board.

8. The semiconductor integrated circuit device as defined in claim 3 wherein the external electrode has a larger area than the electrode underlayer.

9. The semiconductor integrated circuit device as defined in claim 6 including solder on the external electrode.

10. A mounting substrate comprising:
    a semiconductor substrate having a first surface and including an electrode on the first surface of the semiconductor substrate;
    a glass coating film covering the first surface of the semiconductor substrate except the electrode;
    an external electrode on the electrode, in electrical contact with the electrode, and having a substantially planar polished external surface;
    a cured resin layer on the glass coating film, forming a barrier against intrusion of moisture and ions into the semiconductor substrate, the cured resin layer having the same area as the semiconductor substrate and a substantially planar polished external surface; and
    a mounting substrate wherein the mounting substrate is soldered to the semiconductor substrate.

11. The mounting substrate as defined in claim 10 comprising solder on the external electrode.

12. The mounting substrate of claim 10 wherein the mounting substrate is a burn-in board for performing a burn-in test.

13. The mounting substrate of claim 10 including a heat radiating fin adhered by a conductive grease to a rear surface of the semiconductor substrate.

14. A semiconductor wafer comprising a plurality of semiconductor devices, each semiconductor device comprising:
    a semiconductor substrate having a first surface and including an electrode on the first surface of the semiconductor substrate;
    a glass coating film covering the first surface of the semiconductor substrate except the electrode;
    an external electrode on the electrode, in electrical contact with the electrode, and having a substantially planar polished external surface; and
    a cured resin layer on the glass coating film, forming a barrier against intrusion of moisture and ions into the semiconductor substrate, the cured resin layer having the same area as the semiconductor substrate and a substantially planar polished external surface.

* * * * *